United States Patent
Loopstra et al.

(10) Patent No.: US 7,292,312 B2
(45) Date of Patent: Nov. 6, 2007

(54) LITHOGRAPHIC APPARATUS AND METHOD FOR CALIBRATING THE SAME

(75) Inventors: Erik Roelof Loopstra, Heeze (NL); Leon Martin Levasier, Hedel (NL); Rene Oesterholt, Vught (NL)

(73) Assignee: ASML Netherlands B.V., Veldhoven (NL)

( * ) Notice: Subject to any disclaimer, the term of this patent is extended or adjusted under 35 U.S.C. 154(b) by 85 days.

(21) Appl. No.: 11/179,665

(22) Filed: Jul. 13, 2005

(65) Prior Publication Data

US 2006/0023178 A1 Feb. 2, 2006

Related U.S. Application Data

(63) Continuation-in-part of application No. 10/899,295, filed on Jul. 27, 2004.

(51) Int. Cl.
*G03B 27/42* (2006.01)
*G03B 27/58* (2006.01)
*G03B 27/62* (2006.01)

(52) U.S. Cl. ............................ 355/53; 355/72; 355/75

(58) Field of Classification Search ................ 355/30, 355/53, 67, 69, 72–75; 356/496–500, 508–510, 356/5; 359/566
See application file for complete search history.

(56) References Cited

U.S. PATENT DOCUMENTS

| | | | | |
|---|---|---|---|---|
| 3,957,378 A | * | 5/1976 | Zipin | .......................... 356/619 |
| 6,285,444 B1 | | 9/2001 | Osanai et al. | ................... 355/72 |
| 6,686,991 B1 | | 2/2004 | Binnard et al. | ................ 355/72 |
| 2002/0041380 A1 | | 4/2002 | Kwan | |
| 2004/0051881 A1 | | 3/2004 | Holzapfel et al. | .......... 356/616 |
| 2004/0263846 A1 | * | 12/2004 | Kwan | .......................... 356/399 |

FOREIGN PATENT DOCUMENTS

| | | |
|---|---|---|
| EP | 1 182 509 A2 | 2/2002 |
| EP | 1 400 855 A2 | 3/2004 |

OTHER PUBLICATIONS

European Search Report issued for European Patent Application No. 05076665.8-2222, dated Feb. 10, 2006.
Singapore Patent Office Communication—Invitation to Respond to Written Opinion dated Aug. 14, 2006.
Australian Written Opinion and Search Report mailed Jul. 6, 2006.

* cited by examiner

*Primary Examiner*—Henry Hung Nguyen
(74) *Attorney, Agent, or Firm*—Pillsbury Winthrop Shaw Pittman LLP

(57) ABSTRACT

Lithographic apparatus includes a substrate table and a motion control system for controlling a movement of the substrate table. The motion control system includes at least 3 position detectors constructed for detecting a position of the substrate table. For measuring a position and orientation of the substrate table, each position detector comprises an optical encoder of a single dimensional or multi dimensional type, the optical encoders being arranged for providing together at least 6 position values, at least one position value being provided for each of the 3 dimensions. Some of the optical encoders may be connected to the substrate table at different locations in the 3 dimensional coordinate system. The motion control system is arranged to calculate the position of the substrate table in the 3 dimensional coordinate system from a subset of at least 3 of the 6 position values and to calculate an orientation of the substrate table with respect to the coordinate system from another subset of at least 3 of the 6 position values. Further, a method for calibrating the position detectors is presented.

16 Claims, 6 Drawing Sheets

```
┌─────────────────────────────┐
│   create first pattern with │
│  reference lithographic appts. │──── 100
└─────────────────────────────┘

┌─────────────────────────────┐
│  create second pattern with │
│  lithographic appts. comprising │
│  to be calibrated position detector │──── 101
└─────────────────────────────┘

┌─────────────────────────────┐
│  compare reference marks of │
│  second pattern with those of │
│       first pattern         │──── 102
└─────────────────────────────┘

┌─────────────────────────────┐
│  determine position deviations │
│  between reference marks of │
│    first and second matrix  │──── 103
└─────────────────────────────┘

┌─────────────────────────────┐
│   store position deviations │
│     in calibration matrix   │──── 104
└─────────────────────────────┘
```

Fig 4

LITHOGRAPHIC APPARATUS AND METHOD FOR CALIBRATING THE SAME

RELATED APPLICATIONS

The present application is a Continuation-In-Part of U.S. patent application Ser. No. 10/899,295, filed Jul. 27, 2004 which is now allowed, the entire contents of which is hereby incorporated by reference.

BACKGROUND OF THE INVENTION

1. Field of the Invention

The present invention relates to a lithographic apparatus and method for calibrating the same.

2. Description of the Related Art

A lithographic apparatus is a machine that applies a desired pattern onto a target portion of a substrate. Lithographic apparatus can be used, for example, in the manufacture of integrated circuits (ICs). In that circumstance, a lithographic patterning device, which is alternatively referred to as a "mask" or "reticle," may be used to generate a circuit pattern corresponding to an individual layer of the IC, and this pattern can be imaged onto a target portion (e.g., comprising part of, one or several dies) on a substrate (e.g., a silicon wafer) that has a layer of radiation-sensitive material (i.e., resist).

In general, a single substrate will contain a network of adjacent target portions that are successively exposed. Known lithographic apparatus include so-called steppers, in which each target portion is irradiated by exposing an entire pattern onto the target portion in one go, while in so-called scanners, each target portion is irradiated by scanning the pattern through the projection beam in a given direction (the "scanning"-direction) while synchronously scanning the substrate parallel or anti-parallel to this direction.

The term "patterning device" used herein should be broadly interpreted as referring to a device that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit (IC).

The patterning device may be transmissive or reflective. Examples of patterning means include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

Lithographic apparatuses generally employ a motion control system. The motion control system comprises a position detector for detecting a position of the substrate table in at least a plane, i.e. in at least two dimensions and a controller constructed for driving the actuator in dependency on an output signal provided by the position detector. The motion control system thus ensures that the substrate table is in a correct position (within a certain tolerance range) as a position of the substrate table is detected by the position detector, and a difference between the detected position and the desired position is reduced by an appropriate action of the controller. The position detector and controller thus form part of a feed forward and/or feed back control system.

In a current lithographic apparatus, a desired accuracy for the substrate table (also sometimes called a wafer table or wafer stage) is in an order of magnitude of nanometers. Hence, it is required according to the state of the art that the position detector achieves such high accuracy. Furthermore, requirements on the position detector are also high in that the range within which the position detector is required to operate encompasses a range of movement of around 0.5 m, as the substrate table in a lithographic apparatus according to the state of the art is able to make movements in two dimensions, i.e. in a plane covering around 0.5 m×0.5 m. To achieve these requirements, according to the state of the art, the position detector comprises one or more interferometers, preferably an interferometer for a first dimension and an interferometer for a second dimension perpendicular to the first dimension. A disadvantage of the interferometers however is that it is an expensive position detector.

A further type of position detector, well-known in the general state of the art, is an optical encoder. The encoder consists of a light source, a grating and a detector. By moving the grating with respect to the light source and the detector, changes occur in the light pattern as received by the detector due to e.g. reflection or transmission changes. The grating is thus comprised in an optical path from the light source to the detector and by movement of the grating, the pattern as received by the detector changes. From these changes, displacement of the grating with respect to the light source and detector can be calculated. From these displacements and knowing a starting position, a position can be calculated. As will be known to the skilled person, the above describes an incremental encoder, the skilled person will be familiar with the fact that also absolute encoders exist.

A specific type of optical encoder has been described in co-pending US Patent Pub. Application 2002/0041380, which is incorporated herein by reference. This optical encoder comprises a diffraction type encoder comprising a light beam generator constructed for generating a light beam, a first grating, a second grating, the second grating being movable with respect to the first grating, and a detector arranged for detecting a diffracted beam of the light beam as diffracted on the first and the second grating, one of the gratings being mechanically connected to the substrate table, the other one of the gratings being mechanically connected to a reference base of the lithographic apparatus, a movement of the substrate table causing a movement of the first grating with respect to the second grating and in operation causing a change in the diffracted beam.

The known lithographic apparatus comprises a motion control system for controlling a movement of the substrate table. The substrate table is movable in at least two directions under control of the motion control system. The movement of the substrate table is to be understood as a movement of the substrate table with respect to the projection system, i.e. a movement of the substrate table results in a movement of the patterned radiation beam with respect to the substrate.

SUMMARY OF THE INVENTION

The principles of the present invention, as embodied and broadly described herein, provide a calibration apparatus that calibrates a radiation sensor in a lithographic apparatus having an illumination system. In one embodiment, the apparatus comprises a substrate holder configured to hold a substrate; an illuminator configured to condition a beam of radiation; a support structure configured to support a patterning device that imparts a desired pattern to the beam of radiation; a projection system that projects the patterned beam onto a target portion of the substrate; and a motion control system configured to control a movement of the substrate table, the motion control system comprising a plurality of position detectors that detect a position of the substrate table. At least three of the plurality of position detectors include a single or multi-dimensional optical encoder to provide at least six position values, the optical encoders being coupled to the substrate table at different locations within a three dimensional coordinate system and at least one position value is provided for each dimension of the three dimensional coordinate system. The motion control system is configured to calculate the position of the substrate table within the three dimensional coordinate system from a subset of at least three of the six position values and to calculate an orientation of the substrate table with respect to the three dimensional coordinate system from another subset of the at least three of the six position values.

According to further aspects of the invention, there is provided a method for calibrating the position detector in the lithographic apparatus according to any of the preceding claims, the method comprising creating a first pattern on a substrate comprising a first matrix of reference marks; creating a second pattern on the substrate comprising a second matrix of reference marks; comparing the second matrix of reference marks with the first matrix of reference marks; determining respective position deviations between reference marks of the first matrix and corresponding reference marks of the second matrix; storing the position deviations in the calibration matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system."

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 4 depicts an embodiment of a method for calibrating a position detector of a lithographic apparatus.

DETAILED DESCRIPTION OF THE INVENTION

Figure 1:
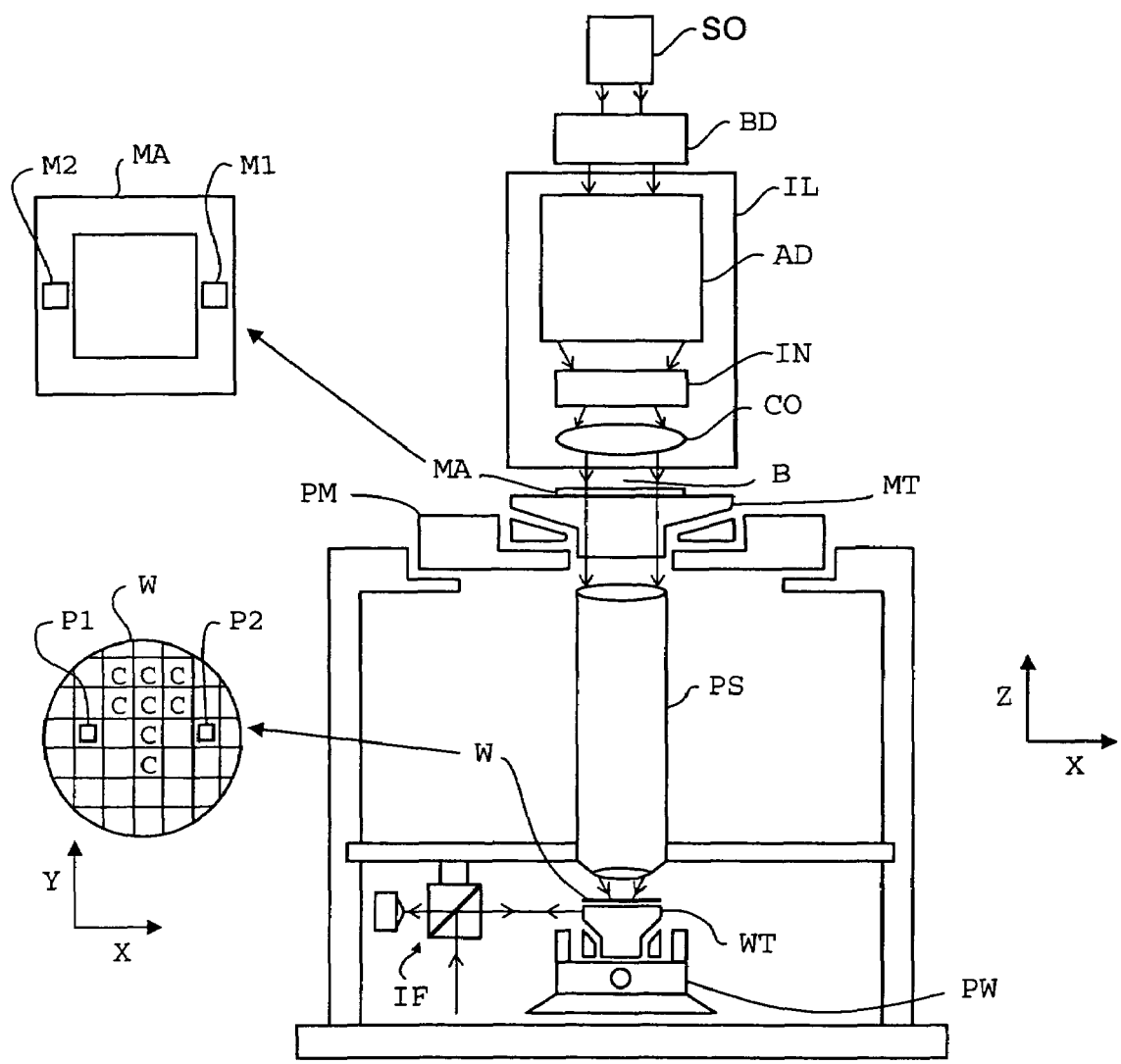
FIG. 1 depicts a lithographic apparatus according to an embodiment of the invention.

FIG. 1 schematically depicts a lithographic apparatus 1 according to an embodiment of the invention. The apparatus 1 comprises:
an illumination system (illuminator) IL: for providing a beam B of radiation (e.g., UV or EUV radiation).
a first support structure (e.g, a mask table/holder) MT: for supporting patterning device (e.g., a mask) MA and coupled to first positioning mechanism PM for accurately positioning the patterning device with respect to item PS;
a substrate table (e.g., a wafer table/holder) WT: for holding a substrate (e.g., a resist-coated wafer) W and coupled to second positioning mechanism PW for accurately positioning the substrate with respect to item PS; and
a projection system (e.g., a reflective projection lens) PS: for imaging a pattern imparted to the beam B of radiation by patterning device MA onto a target portion C (e.g., comprising one or more dies) of the substrate W.

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The illumination system may include various types of optical components, such as refractive, reflective, magnetic, electromagnetic, electrostatic or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position detector IF (according to the state of the art, e.g., an interferometric device, linear encoder or capacitive sensor, according to the invention an optical encoder of the type to be described below), the substrate table WT can be moved accurately, e.g., so as to position different target portions C in the path of the radiation beam B.

Similarly, the first positioner PM and another position detector (which is not explicitly depicted in FIG. 1) can be used to accurately position the mask MA with respect to the path of the radiation beam B, e.g., after mechanical retrieval from a mask library, or during a scan. The positioner, position detector as well as a controller are comprised on a motion control system. The controller is constructed or programmed for driving the positioner based on a signal representing a desired position and an output signal of the position detector representing an actual position. The motion control system can form e.g. a feed-forward or a feed-back control loop. In general, movement of the mask table MT may be realized with the aid of a long-stroke module (coarse positioning) and a short-stroke module (fine positioning), which form part of the first positioner PM.

Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus can be used in the following preferred modes:

step mode: the mask table MT and the substrate table WT are kept essentially stationary, while an entire pattern imparted to the projection beam is projected onto a target portion C in one go (i.e., a single static exposure). The substrate table WT is then shifted in the X and/or Y direction so that a different target portion C can be exposed. In step mode, the maximum size of the exposure field limits the size of the target portion C imaged in a single static exposure.

scan mode: the mask table MT and the substrate table WT are scanned synchronously while a pattern imparted to the projection beam is projected onto a target portion C (i.e., a single dynamic exposure). The velocity and direction of the substrate table WT relative to the mask table MT is determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

other mode: the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In this specification, the terms direction, dimension, and axis, as used, are intended to relate to one and the same coordinate system. Moreover, the term position value is to be understood as meaning an output signal of a position detector, the output signal being representative of a position.

Figure 2A:
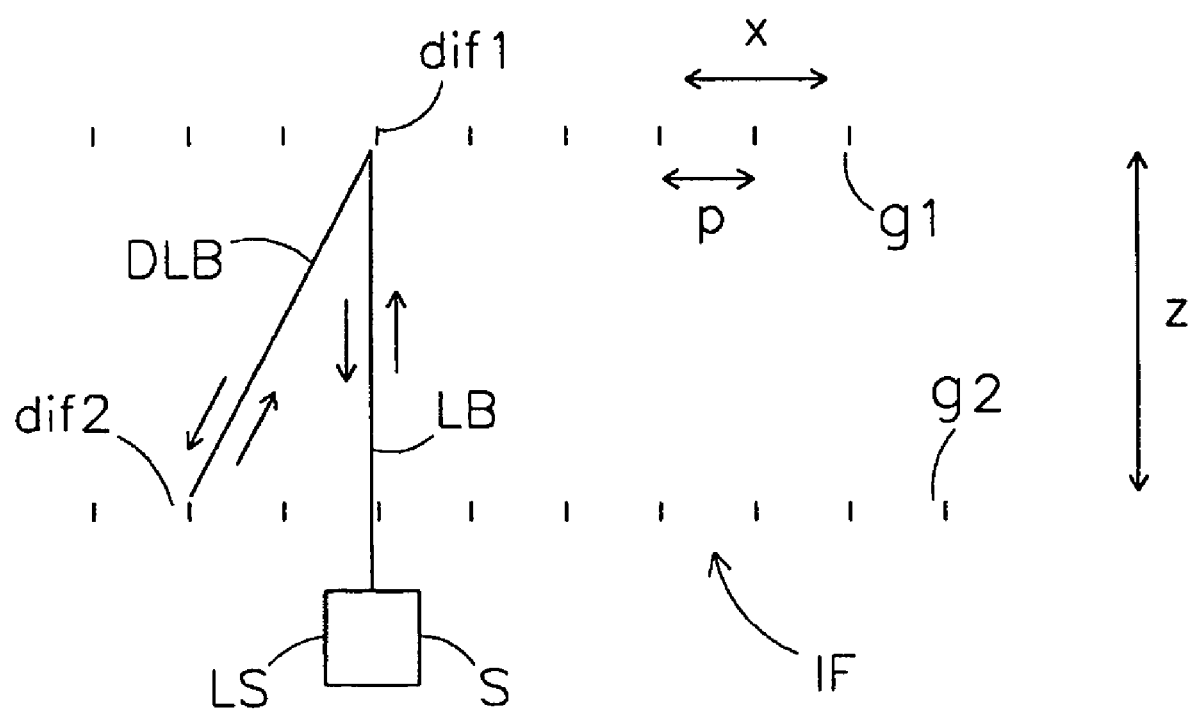
FIG. 2a schematically depicts an exemplary embodiment of an optical encoder of the lithographic apparatus according to the invention.

FIG. 2a shows a schematic view of an embodiment of a position detector of the lithographic apparatus according to the present invention. FIG. 2a depicts a 1-dimensional detector. The position detector IF comprises a first grating g1 and a second grating g2. The first grating g1 and the second grating g2 are positioned parallel to each other. The position detector IF further comprises a light source S which generates a light beam LB. The light beam generates, when incident on the first grating g1, a diffraction pattern, schematically indicated by dif 1, thus generating a diffracted light beam DLB. The diffracted light beam again creates a diffraction pattern dif 2 on the second grating g2, a part of the incident radiation of the light beam travelling a same path (as indicated by DLB, LB) back to the source S.

To detect the diffracted, received radiation, the source is combined with a light sensor LS that detects the radiation which has been diffracted twice, i.e., on the first grating g1 and the second grating g2, and is received back by the light sensor LS. When movement of the substrate table WT takes place, the first grating g1 moves with respect to the second grating g2. This movement, as in the example depicted in FIG. 2a, takes place in the direction indicated by x.

Upon movement along the direction indicated by x, the diffraction patterns of the light beam LB on the first grating g1 and the second grating g2 will change which, in turn, results in a change in the light received back by the light sensor LS. When the first grating g1 and second grating g2 are moved with respect to each other by a distance equal to a pitch p of the grating, the same diffraction pattern will occur, so that the same amount of radiation will be received by the light sensor LS. Thus, periodic changes in the diffraction pattern upon movement of the gratings g1, g2, with respect to each other will result in periodic change of the radiation received back by the light sensor LS. In FIG. 2a, the gratings g1, g2 are schematically indicated by lines, which will provide an adequate solution for a single dimensional position detector IF.

The position detector IF disclosed above with respect to FIG. 2a, may be described as a 1-dimensional encoder. The embodiments described below will, however, make use of 1-dimensional as well as 2-dimensional encoders. A 2-dimensional encoder or position detector can be created by using two separate position detectors as described with reference to FIG. 2a, such that each position detector comprises a set of a first and a second grating. However, in other embodiments, a single, 2-dimensional position detector may be employed. In such a 2-dimensional position detector, a common set of gratings is used for the two position detectors, each detector for detecting a movement of the grating in a different one of the dimensions.

Effectively, two or more sets of encoders, each comprising a light source and a light sensor make use of a common set of gratings. To perform a measurement in more than one dimension, the gratings do not only comprise lines in a single direction, but instead the gratings may comprise a grid that include, for example, lines in two directions, in which the second direction preferably being perpendicular to a first direction.

Alternatively, the gratings may also be configured in a so-called "checkerboard" pattern. In such a pattern, to detect displacements in the x and y directions, a 2-dimensional position detector comprises two light sources S and two light sensors LS, in which one combination of a light source and a light sensor detects displacement in the x direction and one combination of a light source and a light sensor detects displacement in the y direction.

Figure 2B:
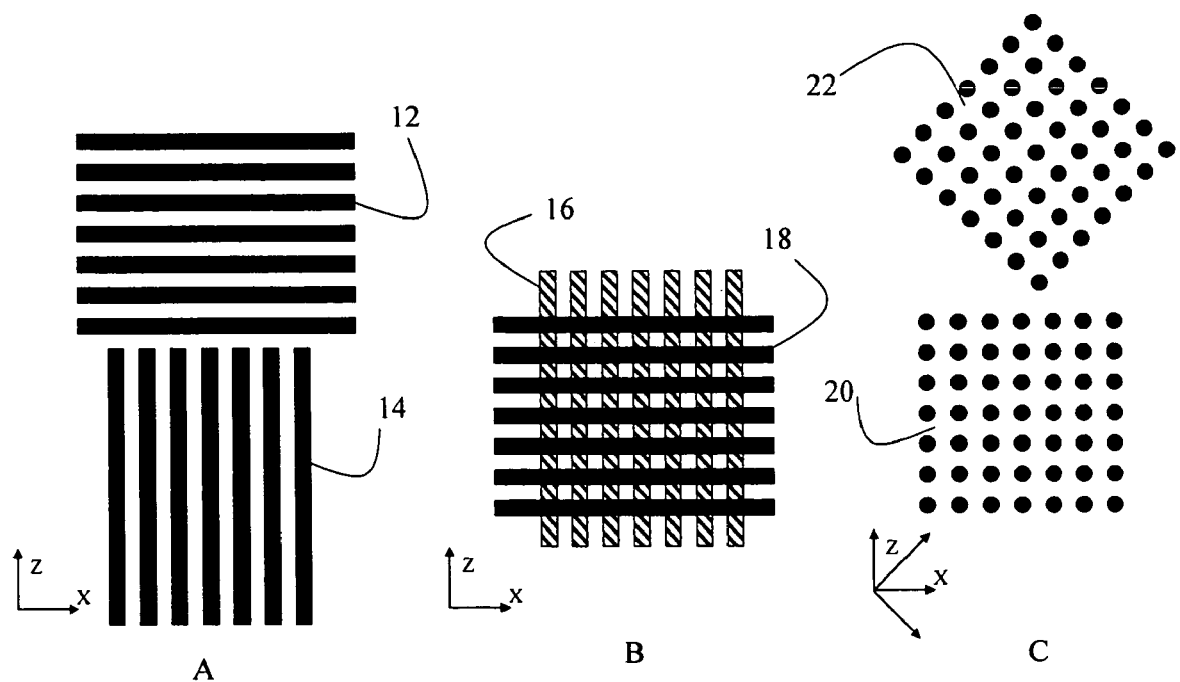
FIG. 2b schematically depicts three possible two-dimensional gratings.

Another possibility is the use of a two-dimensional grid. FIG. 2b schematically depicts three possible arrangements of such a grid. The first arrangement (A) comprises two separated one-dimensional gratings 12, 14. The second arrangement (B) comprises two one-dimensional gratings 16, 18 combined to a two-dimensional grating. The third arrangement (C) shows a two-dimensional grid structure 20. Normal incidence of a light beam (normal to both X- and Z-directions indicated in FIG. 2b) can provide a two-dimensional diffraction when two-dimensional gratings are used. In the arrangement A of FIG. 2b a separate grating has been provided for each dimension. The arrangement B shows a two-dimensional grating on which a light beam can be diffracted in two planes: (i) a first plane comprising the normal vector (normal to the X- and Z-direction as indicated) and the X axis, and (ii) a second plane comprising the normal vector and the Z axis. Arrangement C shows a two-dimensional grid structure 20 that can be used as a diffraction pattern. Reference numeral 22 designates an alternative orientation of the two-dimensional grid structure. This grid structure can result in a diffraction in the following planes: plane one comprising the normal vector and the X-axis, plane two comprising the normal vector and the Z axis, plane three resp. plane four comprising the normal vector and a vector under +45 degrees resp. −45 degrees with the X axis and arranged in the XZ plane. The different arrangements (A, B, C) can be used in combination with one- and two-dimensional encoders.

A two-dimensional grid, can also be used as reflector target for an interferometer. In such a configuration, a 2-or 3-dimensional position detector can operate with the same target.

The two-dimensional grid may comprise one or two reflecting surfaces at different levels relative to an incoming wavefront of a light source. When encoders are used, the difference in optical path length between light reflected at the first and second reflecting surface is generally selected to a quarter wave length in order to reduce the zero order reflection. The two-dimensional grid can act as reflector of a plane mirror interferometer system provided that interference of zero order normal incidence light that is reflected by the first and second reflector surface is not completely destructive and of sufficient intensity to drive the system. By changing the distance between the first and second reflecting surface of the grid, using a different wavelength or varying the size of the grid pixel area, a combination can be made such that a reflection of interferometer beams of a plane mirror interferometer results in a sufficient signal modulation such that a displacement of the grid perpendicular to the beams can be detected.

As such, an interferometer encoder combination can be realized for measuring the position of an object. Such an interferometer encoder combination can, in general, comprise a one- or two-dimensional encoder comprising a one- or two dimensional grating (or grid), an optical sensor and an interferometer system having an interferometer beam arranged to apply the grating as a reflector.

The position detector IF as described with reference to FIG. 2a comprises a diffraction type encoder, the source S may also be referred to as a light beam generator and the light sensor LS may also be referred to as a detector.

It will be appreciated by the skilled person that instead of, or in addition to, the diffraction type encoder described above, also other types of encoders can be used. Furthermore, in the example described in FIG. 2a, the position detector IF comprises an incremental encoder, although an absolute encoder may be used.

As will become more clear below, an advantage of the diffraction type of encoder described above, is that a distance between the gratings, i.e. the distance along the direction indicated by z in FIG. 2a, can vary over a large range in this particular type of encoder, hence making it particularly suitable for use with a substrate table, as the substrate table is commonly able to move in a plane of around 0.5 times 0.5 meters. The gratings may thus be positioned on a short distance relative to each other, however they may also be positioned at tens of centimeters, or even 0.5 m apart.

As the displacement range of the substrate or wafer table WT may be very large, the position detector of the diffraction type may be used in various types of 1-dimensional and 2-dimensional encoders as will be explained with reference to FIGS. 3a, 3b below. Assuming that the wafer table WT is moveable along a plane defined by the co-ordinates x and y, then the diffraction type encoder may be applied for detecting movements of the substrate table WT in any direction. The diffraction type encoder may be applied in a configuration where the direction x in FIG. 2a corresponds to the x dimension and the direction indicated by z corresponds to, for example, a direction perpendicular to the x-y plane of movement of the wafer table WT.

In another embodiment, it is possible that the diffraction type encoder is applied in a configuration where the direction z as indicated in FIG. 2a corresponds to an x axis or y axis. In that case, the displacement in the direction indicated by z may be as large as the range of movement of the wafer table WT. In that situation, the feature of the diffraction type encoder that it is very intolerant to a change in the distance between the gratings g1 and g2, becomes particularly advantageous.

Figure 2C:
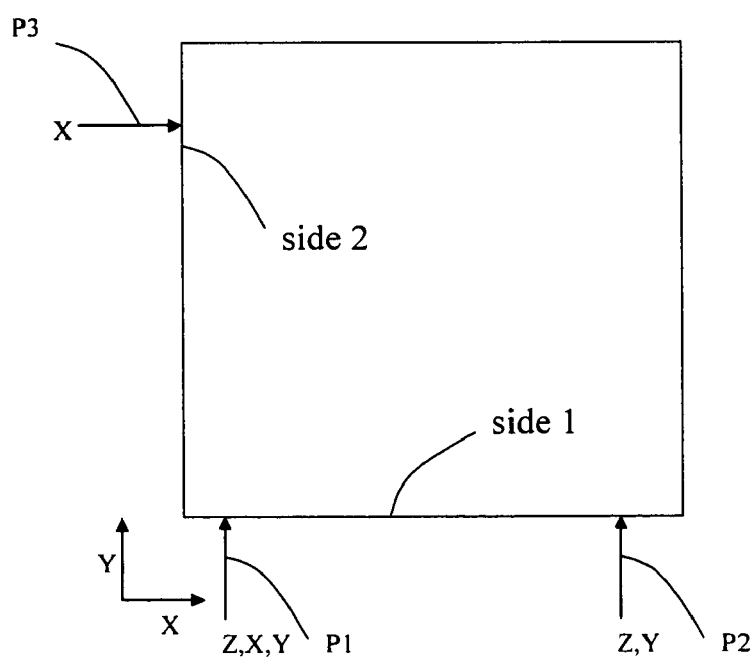
FIG. 2c schematically depicts a first 6 DOF measuring configuration comprising an interferometer encoder combination FIG. 2d schematically depicts a second 6 DOF measuring configuration comprising an interferometer encoder combination.

Different embodiments are possible to obtain a 2- or 3-dimensional position measuring unit comprising 1 or 2 diffraction type encoders combined with a plane mirror interferometer, wherein a two-dimensional grid is used as a reflecting target. FIG. 2c schematically depicts a 6 degree of freedom (DOF) measurement configuration in the XY plane. In this embodiment, position detectors P1, P2 and P3 are connected to sides of the substrate stage, and targets are connected to a reference frame in the surroundings of the stage. Position detectors (or sensors) P1 and P2 can be arranged on side 1 of the substrate table, position detector (or sensor) P3 can be arranged on side 2. As indicated, position detector P1 enables a position measurement of the substrate table in the x, y and z dimension, position detector P2 enables a position measurement of the substrate table in the z and y dimension, position detector P3 enables a position measurement of the substrate table in the x dimension. As such, the target of sensor P1 can be a two-dimensional grid enabling a position measurement in X and Z dimension, while, in order to perform the position measurement in the Y-direction, said grid is arranged as a reflector as described above.

The target of sensor P2 can, for example, be an encoder grid arranged to measure the Z-position of the substrate table and further arranged to reflect a light beam to the sensor P2 in order to measure the Y-position. Sensor P3 can, for example, comprise a plane mirror interferometer, as such, the target of sensor P3 can be an encoder grid (as described above) or a reflecting plane mirror. In the arrangement as shown, the grids co-operating with the sensors and the sensors can substantially be arranged in the same XY-plane. Alternatively, the sensors can be connected to a reference frame, while the combined encoder, interferometer grid plates can be connected to the substrate stage.

Figure 2D:
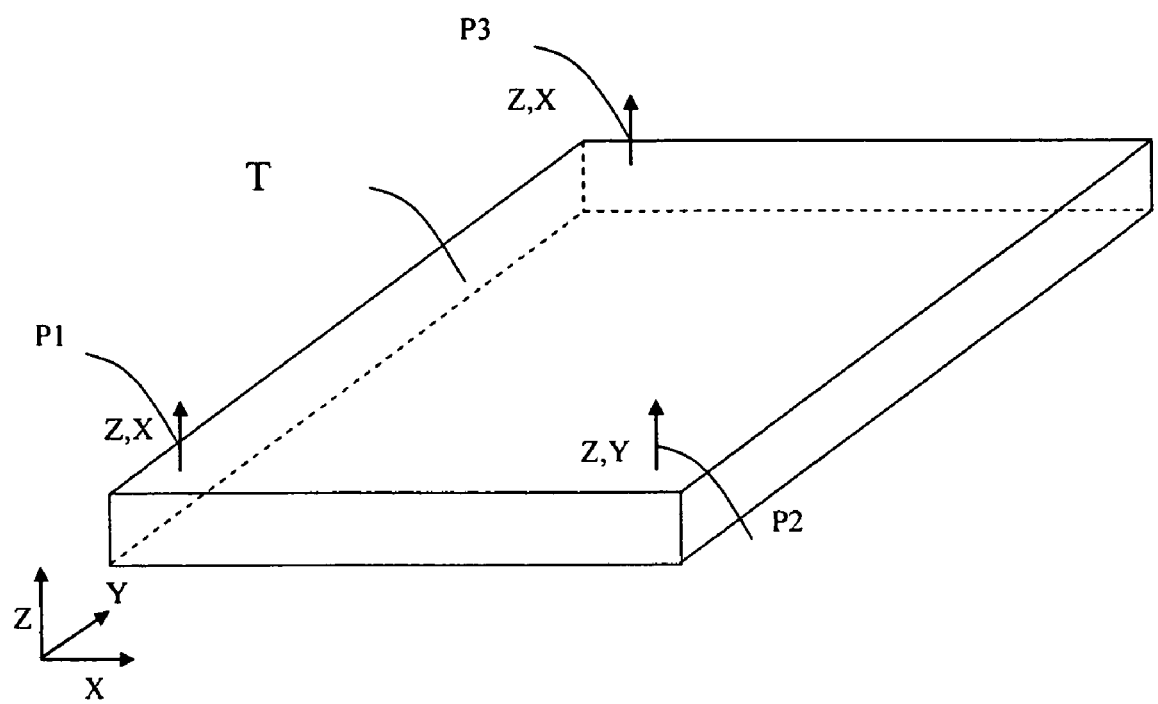

FIG. 2d schematically depicts a possible embodiment of a 6 DOF vertical configuration comprising three two-dimensional measuring heads P1, P2, P3. The measuring heads can be arranged to cooperate with a reflecting two-dimensional grid that can, for example, be connected to a reference frame arranged adjacent to the top side T of the measuring heads arrangement. The measuring heads and the grid are arranged such that each reading head can provide positional information with respect to the Z-direction and an additional direction (X or Y), as indicated in FIG. 2d. As such, the two-dimensional grid acts as a reflective surface such that a reflected light beam can be received by the measuring heads in order to provide positional information with respect to the Z-position. The positional information with respect to the additional direction (X or Y) can be obtained To further increase accuracy of the position detector, the gratings of the position detector may comprise a plate made of a low thermal expansion material, preferably comprising a glass or a ceramic. Further, the gratings may comprise a channel, the channel being connected to a fluid circulation system comprising a thermal stabilization unit for stabilizing a temperature of the grating by acting on a temperature of the fluid in the fluid circulation system. In this manner, the temperature of the grating can be stabilized, i.e., the grating being heated or cooled by the fluid in the fluid circulation system.

Advantageous configurations of a lithographic apparatus comprising a plurality of position detectors according to the invention will now be described with reference to FIGS. 3a and 3b. The embodiments as described with reference to FIGS. 3a and 3b may make use of the diffraction type encoder as described above, although it will be appreciated that other types of encoders may be used.

Figure 3A:
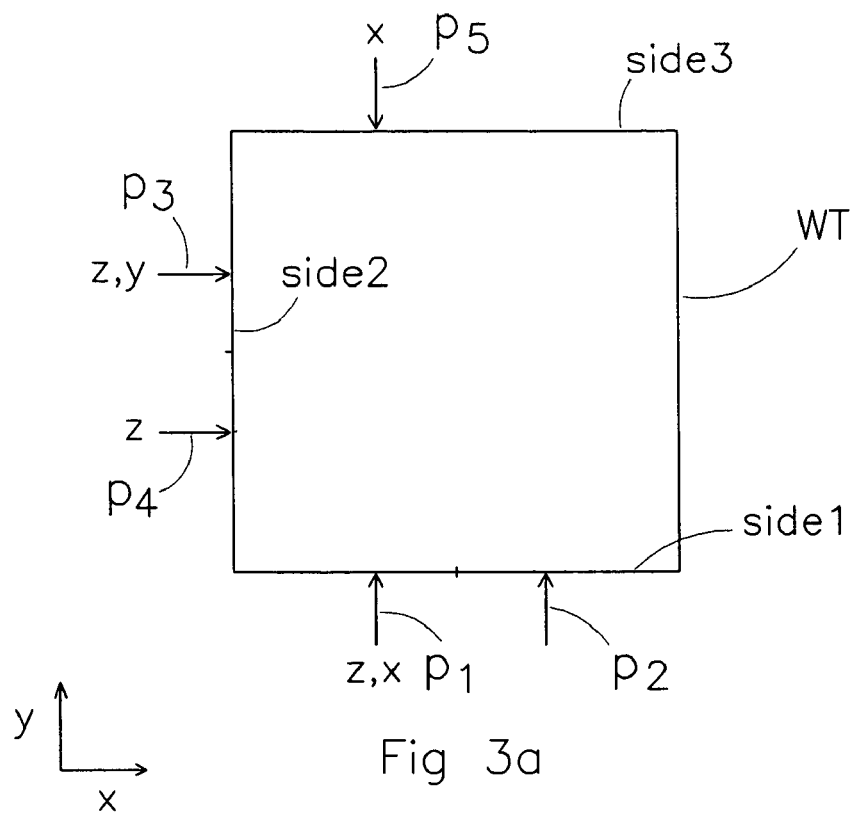
FIGS. 3a and 3b each depict a configuration of a substrate table and a plurality of position detectors according to embodiments of the invention.

FIG. 3a depicts a top view of the substrate or wafer table WT. The wafer table WT in this embodiment includes five (5) position detectors p1-p5, preferably of the encoder types described above. The wafer table WT comprises a first side, indicated in FIG. 3a by side 1 which is substantially parallel to an x axis of a co-ordinate system. The wafer table WT further comprises a second side, in FIG. 3a indicated by side 2 which is substantially parallel to an y axis of the co-ordinate system. The wafer table WT further comprises a third side, in FIG. 3a indicated by side 3 which is opposite to the first side and hence again substantially parallel to the x axis.

A first position detector p1 and a second position detector p2 are coupled to, respectively, a first and a second portion of the first side, the first and second portion of the first side separated by a center of the first side. The first position detector p1 comprises a 2-dimensional encoder and is arranged for measuring a position of the wafer table WT along the x and z dimensions (thus providing a position value for the x and z dimensions), where the z dimension is perpendicular to the x and y dimensions. The second position detector p2 is configured as a 1-dimensional encoder and is arranged for measuring a position in the z dimension.

A motion control system (not shown in FIGS. 3a, 3b) is programmed for determining from an output signal of the first position detector p1, a position of the wafer table WT in the x dimension and from output signals of the first and the second position detectors p1, p2, a rotation of the wafer table WT around the y axis.

Similarly, a third position detector p3 and a fourth position detector p4 are coupled to, respectively, a first and a second portion of the second side, the first and second portion of the second side separated by the second side, in FIG. 3 indicated by side 2. The third encoder p3 is configured as a 2-dimensional encoder in the y dimension and z dimensions while the fourth encoder p4 is a 1-dimensional encoder in the z dimension.

The motion control system determines from an output signal of the third position detector p3 a position in the y dimension and from combined output signals of the third and fourth position detectors p3, p4 a rotation of the wafer table WT with respect to the x axis.

The fifth position detector p5 is mechanically connected to the third side, in FIG. 3 indicated by side 3, and is arranged to measure a position of the wafer table WT in the x dimension. The motion control system is programmed for deriving from output signals of the first and the fifth position detectors p1, p5 a rotation of the wafer table WT with respect to the z axis. Alternatively to the configuration as described with reference to FIG. 3a, variations thereof are possible, placing p3 and p4 at a side of the wafer table WT opposite to the second side, changing places of p3 and p4, etc.

The position detectors p1-p5 thus provide a total of 7 output signals, i.e., position values: p1 and p3 each provide 2 position values (each being 2-dimensional encoders) while p2, p4 and p5 each provide one position value (each being 1-dimensional encoders) and the motion control system calculates a position and orientation with these position value.

The first and second position detectors, and similarly the third and fourth position detectors can make use of a common gratings. Thus, one set of two gratings is shared by the first and second position detectors, and one set of two gratings is shared by the third and fourth position detectors.

In a practical implementation, the range wafer table WT movement in the x and y dimensions (i.e., the plane along the surface of the substrate), will be larger or substantially larger than a range of movement in the direction perpendicular thereto (i.e., the z-dimension). Thus, the gratings as shared by two position detectors (e.g. p1 and p2, or p3 and p4) will have a large dimension along the x-axis (p1, p2) respectively the y-axis (p3, p4), but only require a smaller dimension along the z-axis because of the smaller range of movement along the z-axis.

Furthermore, in a practical embodiment, the encoders will be calibrated (e.g., making use of a calibration matrix) in the x and y directions. This is because the smaller range of movement in the z direction, the inherent calibration accuracy of the encoders will be sufficient, thus mostly obviating a calibration to increase accuracy.

For increased accuracy, the pairs of position detectors p1, p2 and p3, p4 will be spaced apart as much as possible. On the other hand, increasing the space between these position detectors will require an increase in the length along the x (p1, p2) or y (p3, p4) direction of the gratings associated with that pair of position detectors, to avoid that a usable range of movement in that pair of position detectors (and thus of the wafer table WT) would be decreased. Thus, in practice a compromise between these requirements may be required.

Further, it is possible that position detector p2 may be omitted, resulting in decreased accuracy when the wafer table WT is near its rightmost position. This is because the rightmost position an accuracy of p3 and p4 is decreased as a distance between the gratings of p3 as well as p4 is increased.

Figure 3B:
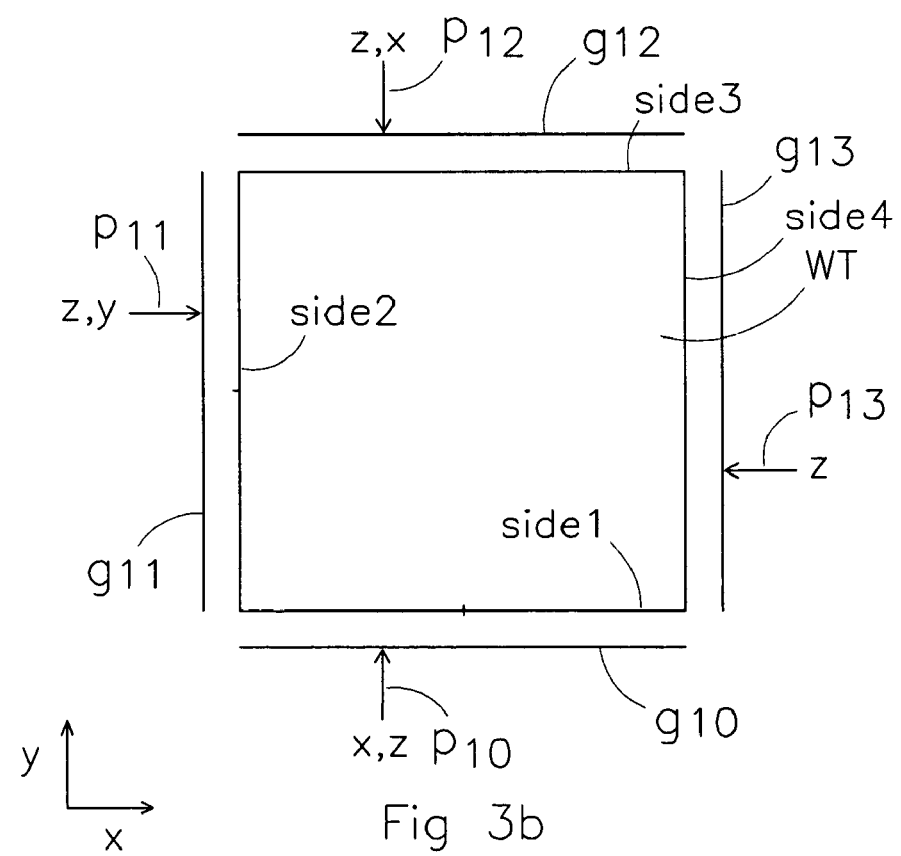

FIG. 3b depicts a top view of a wafer table WT and a plurality of optical position detectors in accordance with another embodiment of the invention. In FIG. 3b, the movable wafer table WT is shown in its center position (i.e. in a center with respect to a range of movement in any of the first, second and third dimension). In this embodiment, a first position detector p10 is connected to a first side Side1 of the wafer table WT. The first side Side 1 is substantially parallel to the first dimension.

The first position detector p10 comprises a two dimensional encoder arranged for providing a position value in the first (x) and the third (z) dimension. A grating g10 of the first position detector p10 extends along a length of the first side, side 1. The grating g10 is mechanically coupled to the wafer table WT so as to follow the movement thereof. The first position detector p10, or at least a light source thereof (both not shown in detail in FIG. 3b), is preferably positioned to direct a light beam towards a center the grating g10 when the wafer table WT is in a center position thereof. Hence, a range of movement in the direction along the x-axis can be made large. That is, the movement can be made substantially equal to the length of the first side, side1, while the light source and optical detector are in operative contact with the grating g10 over the full range of movement.

The position detector p10 preferably comprises a diffraction type encoder as described above and may thus comprise a second grating (not shown) which does not follow a movement of the wafer table WT, i.e., is stationary with respect thereto.

FIG. 3b further shows a second position detector p11 at a second side, side2, which is substantially perpendicular to the first side. The second position detector p11 is configured as a two dimensional encoder comprising a grid g11 and provides a position signal in the second (y) and third (z) dimensions.

Also, FIG. 3b shows a third position detector p12 at a third side, side3. The third position detector p12 is configured as a two dimensional encoder comprising a grid g12 and provides a position signal in the first (x) and third (z) dimension. The same as outlined above with reference to the first encoder g10 also applies to the second and the third encoder.

The motion control system (not shown in detail in FIG. 3b) is arranged to calculate from position values provided by the first second and third position detectors p10, p11, p12 a position of the wafer table WT in all three dimensions of the three dimensional coordinate system as well as an orientation, i.e. a rotational position of the substrate table WT with respect to all three dimensions.

Preferably, a further, fourth position detector p13 is provided at a fourth side, side 4, which is substantially parallel to the second side. The fourth position detector is configured as a one dimensional encoder comprising a grid g13 and provides a position signal in the third (z) dimension. The fourth encoder is particularly useful when the wafer table WT is near its rightmost position (as seen in the plane of drawing), because in that position the distance between a light source and detector of the second position detector p11 on the one hand and the grid g11 thereof on the other hand is at or near its maximum, thereby reducing the accuracy of the second position detector p11.

In such a position, the distance between the light source and detector of the fourth position detector p13 on the one hand and the grid g13 thereof on the other hand is at or near its minimum. Hence, the accuracy of the fourth position detector p13 is not deteriorated at or near the rightmost position of the wafer table WT. A further effect is that the more the wafer table WT has moved towards its rightmost position, the more the position signals of p10, p11 and p12 will provide positions in one line, instead of providing positions at 3 points forming a triangle (as an effective point at which p11 measures a position moves to the right in the plane of the drawing), thereby reducing the ability for the motion control system to determine multidimensional information from the z-position signals of p10, p11 and p12. Thus, the motion control system will preferably give comparatively more weight to a position signal of the fourth encoder p13 near a rightmost position of the substrate table and less weight to a z position signal as provided by p11.

The configurations as depicted in FIGS. 3a and 3b enable, with a minimum amount of position detectors, the measurement of a position of the wafer table WT in all degrees of freedom, i.e., in the dimensions x, y and z as well as orientations around the x, y and z axis, i.e., rotational positions with respect to the x, y and z axis. Further, as explained above with reference to FIG. 2, the encoders as used in the lithographic apparatus according to the invention, not only allow a large range of displacement in a direction of measurement (in FIG. 2 indicated by x), but also allow a large range of displacement in a direction perpendicular thereto (in FIG. 2 indicated by z).

The wafer table WT, as depicted in FIGS. 3a and 3b, has, in practical embodiments, a range of movement of around 0.5 m in the x direction and 0.5 m in the y direction. For at least each of the position detectors p1-p4, this range of movement results in a possible range of a distance between the gratings of a particular detector (i.e., a variation of the distance z according to FIG. 2a) of around 0.5 m. As the diffraction type encoder described above is able to operate accurately over such a large range of distance between the gratings, the configuration as described with reference to FIGS. 3a and 3b may operate accurately over the stated range of movement, thus benefiting from the specific advantages of this type of optical encoder.

The exemplary embodiments as shown in FIGS. 3a and 3b provide some examples of aspects of the invention, however numerous variations are possible. The motion control system can comprise dedicated hardware and/or can comprise a suitably programmed programmable device such as a micro controller, micro processor, etc.

The coordinate system can comprise any orthogonal or non orthogonal coordinate system. As the coordinate system is not "physically present", the dimensions (i.e., the direction of each axis) of the coordinate system can be chosen freely so as to meet the requirements set forth in this specification.

In a further embodiment of the invention, the lithographic apparatus comprises a 2-dimensional encoder in the x-y plane. Due to the large range of movement in x as well as y direction, gratings of such encoder would be large, in a practical embodiment approximately equal to a size of the surface of the substrate. As it is not desirable that such gratings interfere with the patterned beam of radiation, the encoder in this embodiment will be located next to a substrate area of the substrate table, hence effectively approximately doubling a size of the substrate table.

To further increase accuracy of each of the encoders in any of the above embodiments, the encoders may be calibrated. Calibration values (e.g., position correction values or factors) may be stored in a one dimensional (to provide a position calibration along a line) or multi dimensional (to provide a calibration in a plane or multi dimensional space) calibration matrix. Calibration effectively increases accuracy as absolute errors tend to be a comparably large source of error in encoders, while other errors, such as thermal stability can be largely suppressed by other means, such as the use of a low thermal expansion material as described above.

The method for calibrating the position detector in the lithographic apparatus according to the invention will now be described with reference to FIG. 4. In task 100, with a reference lithographic apparatus, a first pattern is created on a substrate, the first pattern comprising a first matrix of reference marks. Then, in task 101, with the lithographic apparatus comprising the to be calibrated position detector, a second pattern is created on the same substrate, the second pattern comprising a second matrix of reference marks.

In task 102, the second matrix of reference marks is compared with the first matrix of reference marks. Should a perfect match between the first and second matrix of reference marks be detected in this task, then the procedure would have provided a perfect match, i.e., no correction required. However, commonly position deviations are determined between the reference marks of the first matrix and the corresponding reference marks of the second matrix, see task 103. The position deviations are then stored in the calibration matrix (task 104). Should no position deviation have been observed, then a value of zero is stored in the calibration matrix. Commonly, the tasks 102-104 are repeated for individual reference marks of the first and second matrix of reference marks, however, it is also possible that these steps are performed for a plurality of reference marks in parallel.

With the method according to the invention, it is possible to create a high amount of matching between various lithographic apparatuses. The reference lithographic apparatus may be calibrated in absolute terms, however it is also possible that the reference lithographic apparatus has obtained no specific highly accurate absolute calibration, the method according to the invention resulting in a high matching between the lithographic apparatus with the to be calibrated position detector and the reference lithographic apparatus: in lithography, matching between various lithographic apparatuses is mostly of a higher importance then absolute accuracy of each of the apparatuses as such.

The method according to the invention may also be applied with a single lithographic apparatus, i.e., the lithographic apparatus with the to be calibrated position detector and the reference lithographic apparatus being the same. The second pattern is in that case created by rotating the substrate by substantially 90 or 180°, the second pattern is being created with the same matrix of reference marks on the same wafer. By a rotation of substantially 90°, a so-called x-to-y or y-to-x calibration can be obtained. By a rotation of substantially 180°, an averaging of position errors can be achieved with the calibration method according to the invention.

Also, when making use of a single lithographic apparatus, i.e., the lithographic apparatus with the to be calibrated position detector and the reference lithographic apparatus being the same, a so-called fishbone technique can be used, the substrate or wafer being translated over a distance of substantially one reference mark, or a plurality thereof, after creating the first pattern and before creating the second pattern. The second pattern is in this manner, displaced with respect to the first pattern by a distance of one reference mark in an ideal case.

By comparing an appropriate reference mark of the second matrix with an appropriate reference mark of the first matrix, a position deviation between the reference marks of the two matrixes can be obtained. This position deviation is stored in the calibration matrix. With the fishbone technique, in contrast to the embodiments of the calibration method as described above, the pattern is usually small compared to the surface area of the substrate.

With the embodiments as described earlier in this specification, a matrix of e.g. 100×100 reference marks is applied, while with the fishbone technique use is made of a matrix of e.g., 3×3 reference marks of 4×4 reference marks. The steps of the fishbone calibration as described above, thus only cover a small part of the surface of the substrate. Therefore, further patterns are created with the lithographic apparatus on the substrate, each pattern being translated with respect to the previous one over a distance of substantially one or more reference marks.

In this manner, a step by step calibration can be performed, a reference mark of a pattern being compared with a reference mark of a previous pattern, position deviations between these reference marks are determined and stored in an appropriate position in the calibration matrix. It will be clear to the skilled person that with the fishbone technique an overlapping of the reference marks of a pattern with a previous pattern is required, thus in practice the translation being over a distance of substantially 1, 2 or 3 reference marks, when a matrix of, e.g., 3×3 or 4×4 reference marks is applied.

Further to the variants as described above, it is also possible to calibrate the position detector of the lithographic apparatus by mounting the position detector in a lithographic apparatus that comprises an interferometer position detector for detecting a position of the substrate table as well as the encoder as described above. The encoder can now be calibrated with the interferometer. Also, as a further variant for the calibration, it is possible to use a calibration matrix as determined for a position detector with any of the method described, as a starting value for calibration of a second position detector in another lithographic apparatus. This has proven to be advantageous and provide a good starting point as in practice a matching between position detectors, especially when produced in a same production batch, appears to be high.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 248, 193, 157 or 126 nm) and extreme ultra-violet (EUV) radiation (e.g., having a wavelength in the range of 5-20 nm), as well as particle beams, such as ion beams or electron beams.

The term "lens," where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

While specific embodiments of the invention have been described above, it will be appreciated that the invention may be practiced otherwise than as described. The description is not intended to limit the invention—rather the scope of the invention is defined by the appended claims.

What is claimed is:

1. A lithographic apparatus, comprising:
   a substrate support configured to support a substrate;
   an illuminator configured to condition a beam of radiation;
   a patterning device support configured to support a patterning device that imparts a desired pattern to the beam of radiation;
   a projection system configured to project the patterned beam onto a target portion of the substrate; and
   a motion control system configured to control a motion of the substrate support or the patterning device support, the motion control system comprising a plurality of position detectors that detect a position of the substrate support or the patterning device support, wherein the plurality of position detectors comprises at least three interferometer encoder combinations, each comprising a one- or two-dimensional encoder grid, an optical sensor and an interferometer, wherein the one- or two-dimensional encoder grid of each of the at least three interferometer encoder combinations is constructed and arranged to co-operate as a reflecting target of the respective interferometer, wherein the optical sensor of each of the at least three interferometer encoder combinations is mounted to the motion controlled support and wherein the one- or two dimensional encoder grid of each of the at least three interferometer encoder combinations is mounted to a reference frame such that the position of the motion controlled support relative to the reference frame can be determined in 6 degrees of freedom.

2. The lithographic apparatus of claim 1, wherein the two-dimensional encoder grid includes two separate one-dimensional grids.

3. The lithographic apparatus of claim 1, wherein the two-dimensional encoder grid includes a single two-dimensional grid.

4. The lithographic apparatus of claim 3, wherein the single two-dimensional grid includes two superposed one-dimensional grids.

5. The lithographic apparatus of claim 1, wherein the two-dimensional encoder grid includes two reflecting surfaces arranged at different levels relative to an incoming radiation of a light source.

6. The lithographic apparatus of claim 5, wherein the two reflecting surfaces are substantially parallel to each other.

7. A motion control system configured to control a motion of an object holder in a lithographic apparatus, the motion control system comprising:
   a plurality of position detectors that detect a position of the object holder, wherein the plurality of position detectors comprises at least three interferometer encoder combinations, each comprising a one- or two-dimensional encoder grid, an optical sensor and an interferometer, wherein the one- or two-dimensional encoder grid of each of the at least three interferometer encoder combinations is constructed and arranged to co-operate as a reflecting target of the respective interferometer, wherein the optical sensor of each of the at least three interferometer encoder combinations is mounted to the object holder and wherein the one- or two-dimensional encoder arid of each of the at least three interferometer encoder combinations is mounted to a reference frame such that the position of the object holder relative to the reference frame can be determined in 6 degrees of freedom.

8. The motion control system of claim 7, wherein the two-dimensional encoder grid includes two separate one-dimensional grids.

9. The motion control system of claim 7, wherein the two-dimensional encoder grid includes a single two-dimensional grid.

10. The motion control system of claim 9, wherein the single two-dimensional grid includes two superposed one-dimensional grids.

11. The motion control system of claim 7, wherein the two-dimensional encoder grid includes two reflecting surfaces arranged at different levels relative to an incoming radiation of a light source.

12. The motion control system of claim 7, wherein the two reflecting surfaces are substantially parallel to each other.

13. The motion control system of claim 7, wherein the object holder is a substrate support.

14. The motion control system of claim 7, wherein the object holder is a patterning device support.

15. A device manufacturing method comprising:
  patterning a beam of radiation with a patterning device to form a patterned beam of radiation, the patterning device supported by a pattern support;
  projecting the patterned beam of radiation onto a substrate, the substrate supported by a substrate support; and
  controlling a position of the pattern support or the substrate support, the controlling including detecting the position of the pattern support of the substrate support with a plurality of position detectors, wherein the plurality of position detectors comprises at least three interferometer encoder combinations, each comprising a one- or two-dimensional encoder grid, an optical sensor and an interferometer, wherein the one- or two-dimensional encoder grid of each of the at least three interferometer encoder combinations is constructed and arranged to co-operate as a reflecting target of the respective interferometer, wherein the optical sensor of each of the at least three interferometer encoder combinations is mounted to the controlled support and wherein the one- or two-dimensional encoder arid of each of the at least three interferometer encoder combinations is mounted to a reference frame such that the position of the controlled support relative to the reference frame can be determined in 6 degrees of freedom.

16. The device manufacturing method of claim 15, wherein the two-dimensional encoder grid includes two reflecting surfaces arranged at different levels relative to an incoming radiation of a light source.

* * * * *